United States Patent
Kamo

(10) Patent No.: US 8,535,854 B2
(45) Date of Patent: Sep. 17, 2013

(54) REFLECTIVE EXPOSURE MASK, METHOD OF FABRICATING REFLECTIVE EXPOSURE MASK, METHOD OF INSPECTING REFLECTIVE EXPOSURE MASK, AND METHOD OF CLEANING REFLECTIVE EXPOSURE MASK

(75) Inventor: Takashi Kamo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 163 days.

(21) Appl. No.: 12/972,804

(22) Filed: Dec. 20, 2010

(65) Prior Publication Data

US 2011/0151358 A1 Jun. 23, 2011

(30) Foreign Application Priority Data

Dec. 21, 2009 (JP) ................................. 2009-289633

(51) Int. Cl.
*G03F 1/24* (2012.01)
(52) U.S. Cl.
USPC .......................................................... 430/5
(58) Field of Classification Search
USPC .......................................................... 430/5
See application file for complete search history.

(56) References Cited

U.S. PATENT DOCUMENTS

| 2009/0148781 A1* | 6/2009 | Kamo et al. ........................ 430/5 |
| 2009/0220869 A1* | 9/2009 | Takai ................................. 430/5 |

FOREIGN PATENT DOCUMENTS

| JP | 2-177532 | 7/1990 |
| JP | 6-66251 | 8/1994 |
| JP | 2003-151902 | 5/2003 |
| JP | 2008-85223 | 4/2008 |
| JP | 2008-277585 | 11/2008 |
| JP | 2010-225698 | 10/2010 |
| JP | 2010-232458 | 10/2010 |
| JP | 2011-54719 | 3/2011 |
| JP | 2011-86809 | 4/2011 |

OTHER PUBLICATIONS

Y. Nishiyama et al., "Carbon Contamination of EUV Mask: Film Characterization, Impact on Lithographic Performance, and Cleaning," Proc. of SPIE, vol. 6921, pp. 692116-1-692116-10 (2008).
T. Kamo et al., "EUVL Practical Mask Structure with Light Shield Area for 32nm Half Pitch and Beyond," Proc. of SPIE, vol. 7122, pp. 712227-1-712227-11 (2008).
First Office Action issued by Japanese Patent Office in corresponding Application No. 2009-289633 dated May 22, 2013, 7 pages.
English language abstract of JP 2009-212220 published Sep. 17, 2009.
English language abstract of JP 2009-141223 published Jun. 25, 2009.
English language abstract of JP 2004-200318 published Oct. 14, 2010.

* cited by examiner

*Primary Examiner* — Mark F Huff
*Assistant Examiner* — John S Ruggles
(74) *Attorney, Agent, or Firm* — Finnegan, Henderson, Farabow, Garrett & Dunner, LLP

(57) ABSTRACT

According to one embodiment, a reflective exposure mask comprises a first layer formed on a substrate and including a first light absorbing part which absorbs exposure light and a light reflecting part which reflects the exposure light, and a second layer formed on the light reflecting part and including a second light absorbing part which absorbs the exposure light.

6 Claims, 11 Drawing Sheets

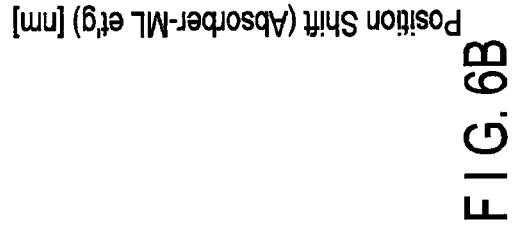
F I G. 6A
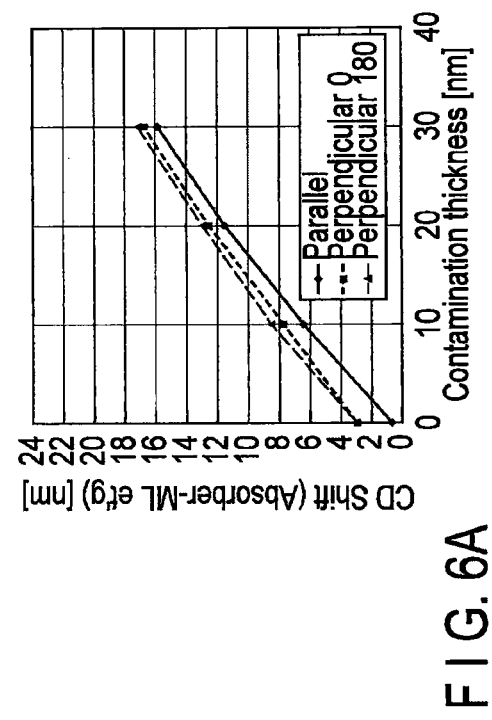
F I G. 6B
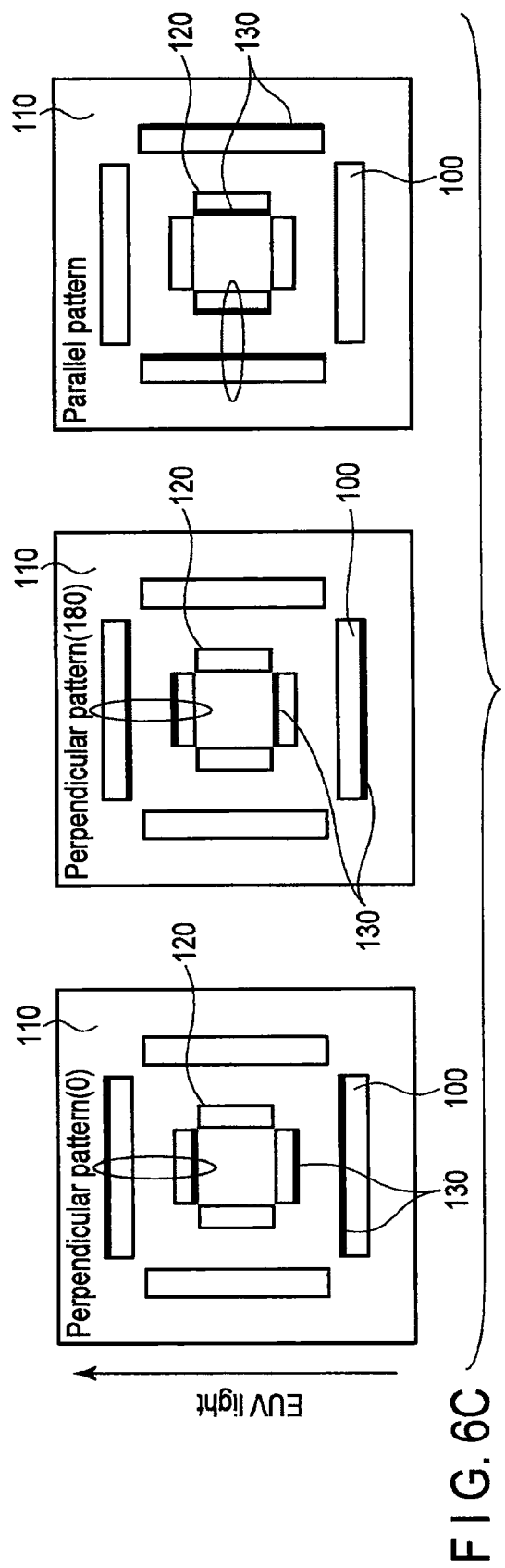
F I G. 6C

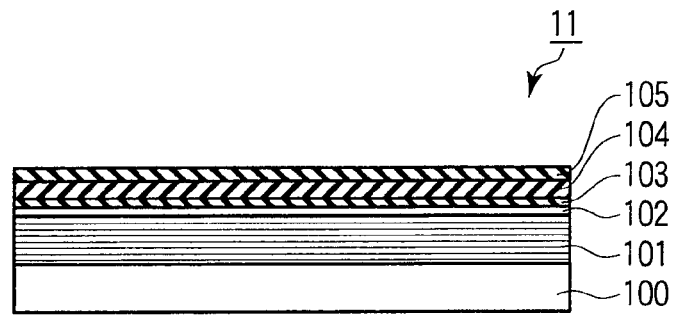
F I G. 7
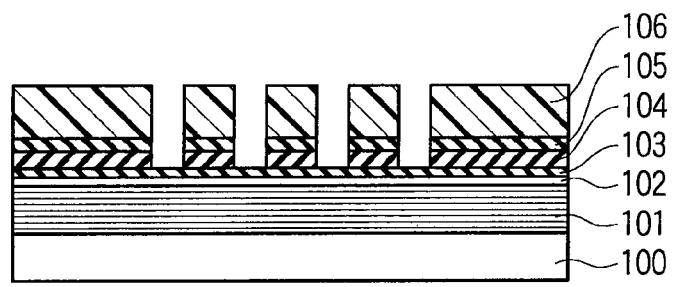
F I G. 8
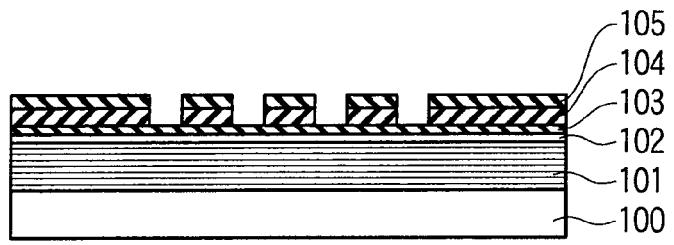
F I G. 9
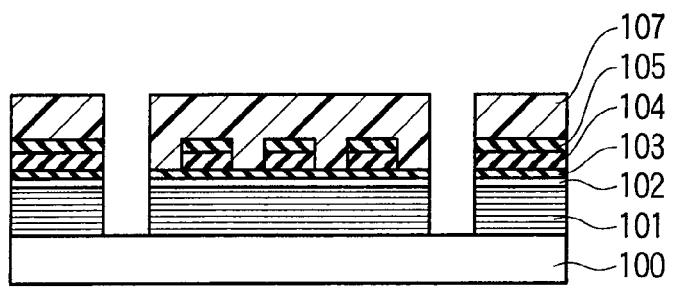
F I G. 10

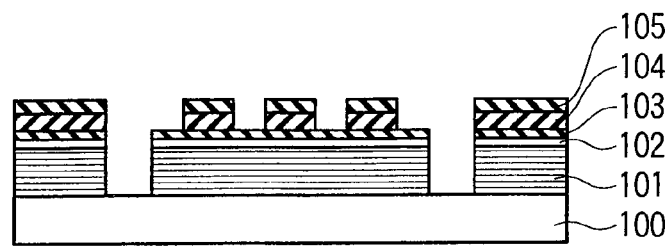
F I G. 11
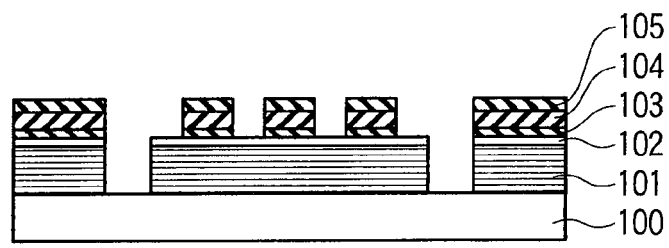
F I G. 12
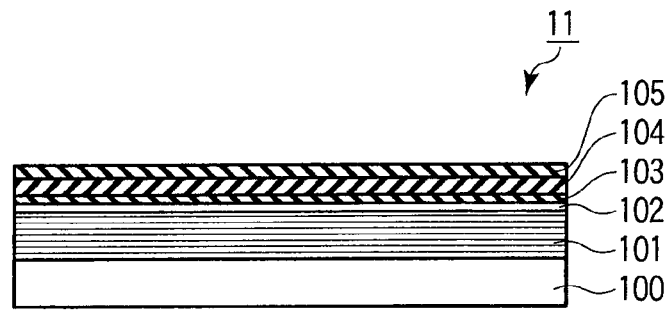
F I G. 13
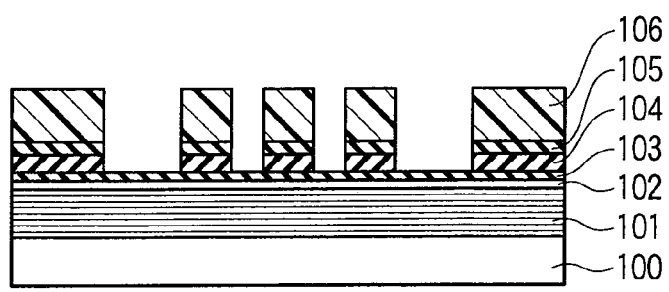
F I G. 14

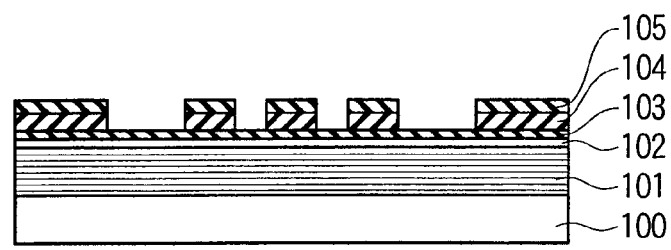
F I G. 15
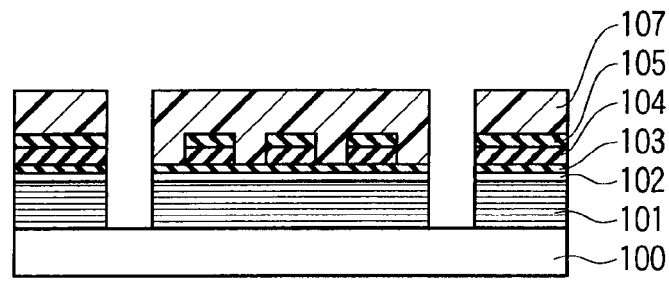
F I G. 16
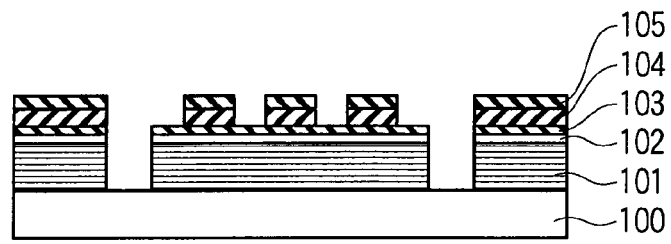
F I G. 17
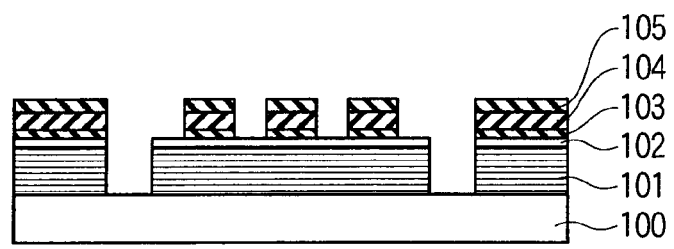
F I G. 18

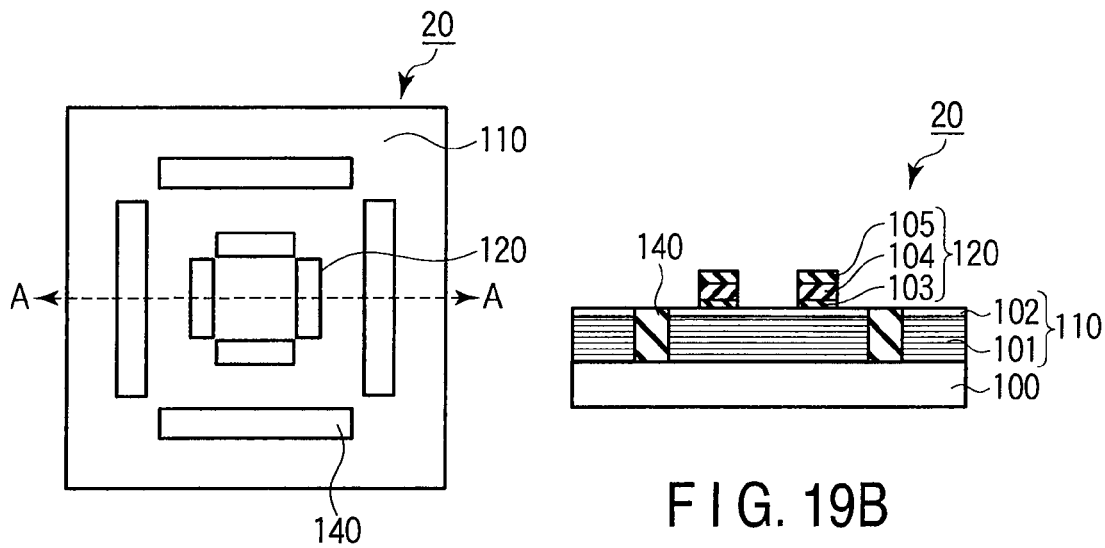
FIG. 19A
FIG. 19B
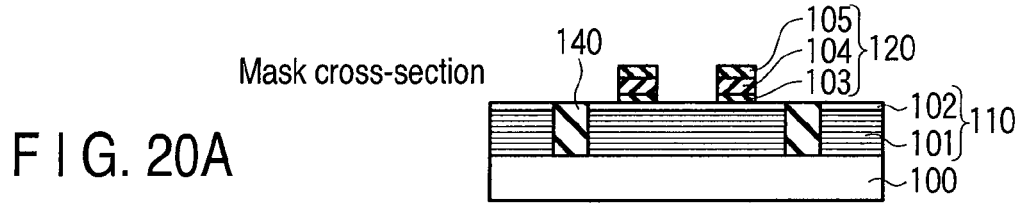
FIG. 20A
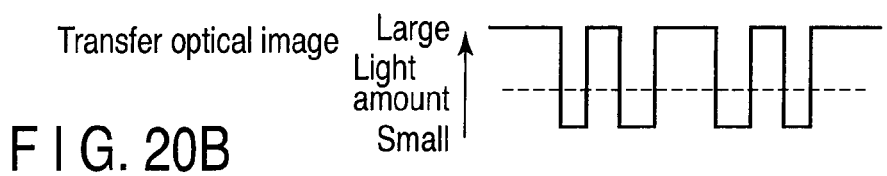
FIG. 20B
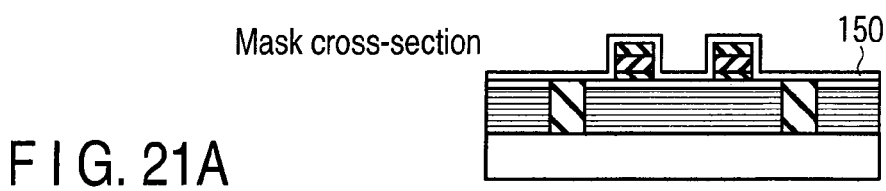
FIG. 21A
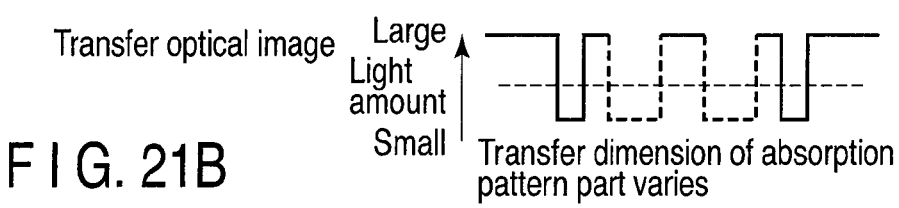
FIG. 21B

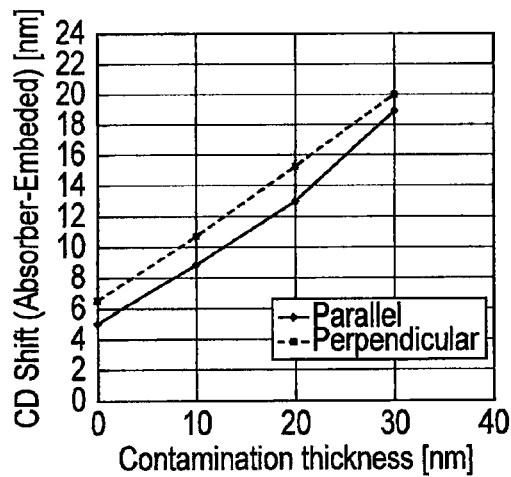
F I G. 22A
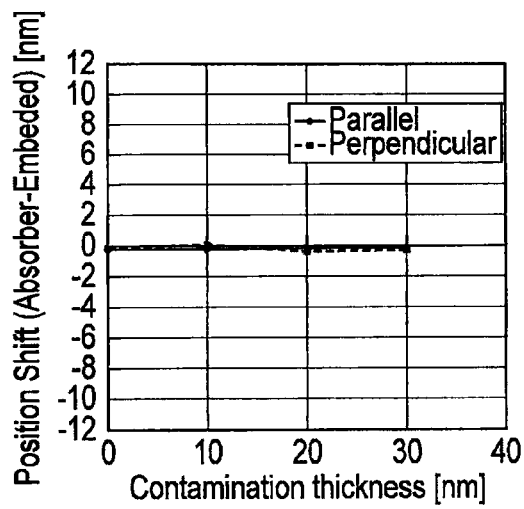
F I G. 22B
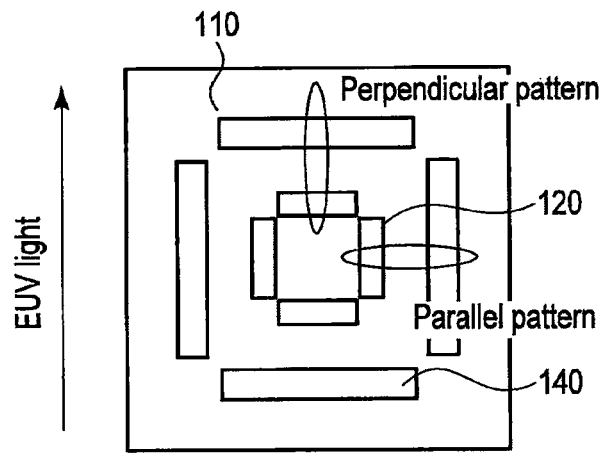
F I G. 22C
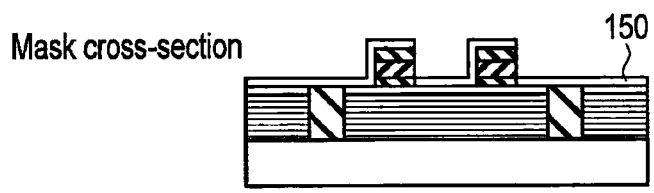
F I G. 23A
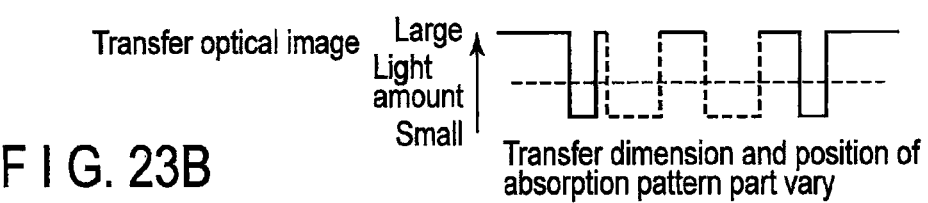
F I G. 23B

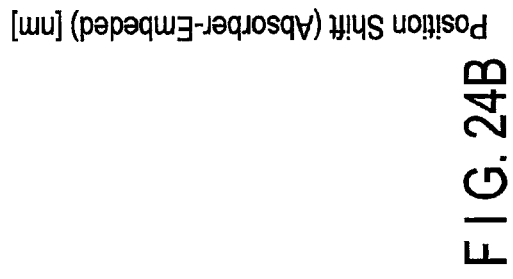
F I G. 24A
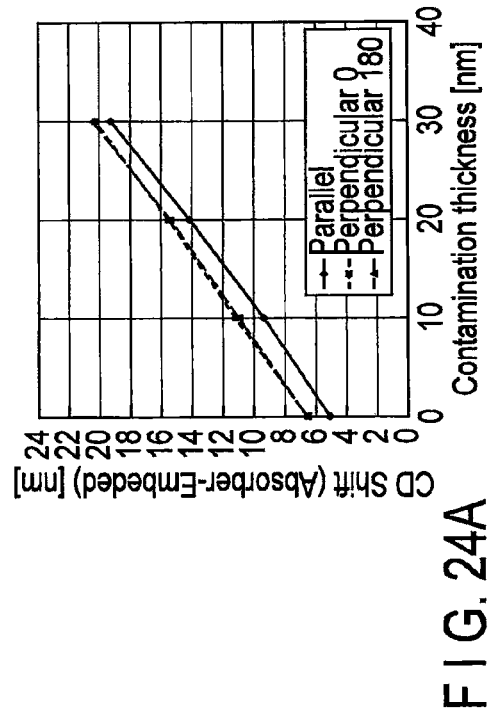
F I G. 24B
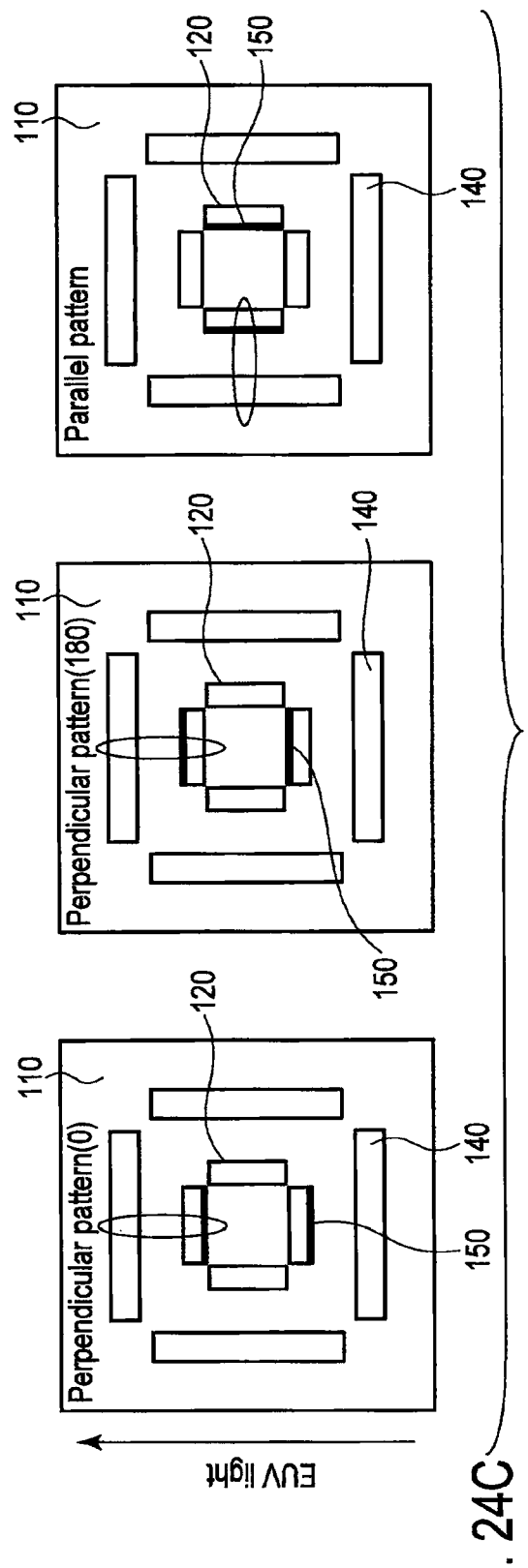
F I G. 24C

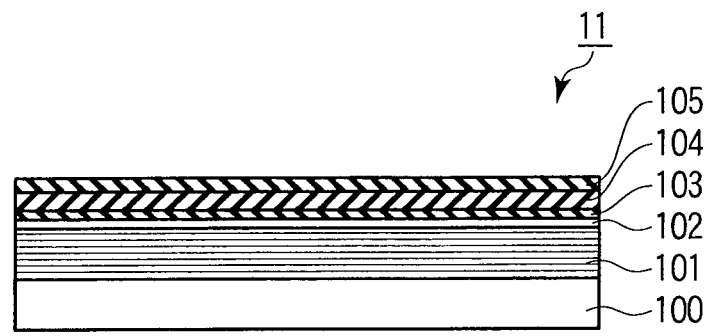
F I G. 25
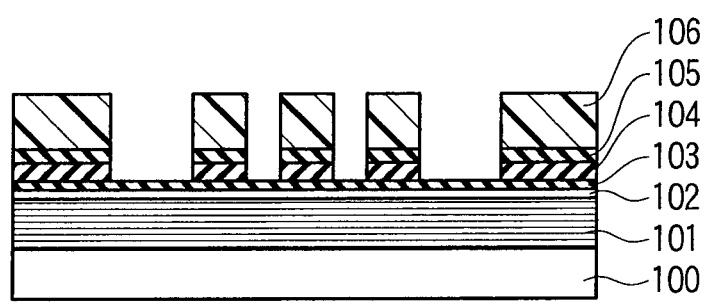
F I G. 26
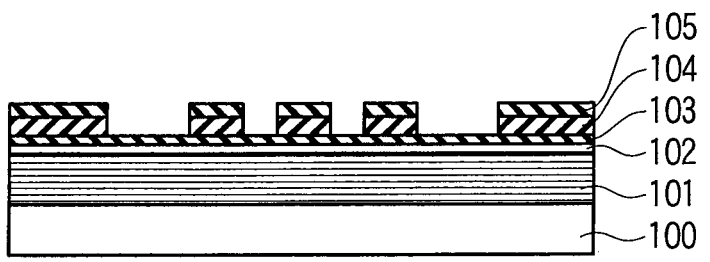
F I G. 27

REFLECTIVE EXPOSURE MASK, METHOD OF FABRICATING REFLECTIVE EXPOSURE MASK, METHOD OF INSPECTING REFLECTIVE EXPOSURE MASK, AND METHOD OF CLEANING REFLECTIVE EXPOSURE MASK

CROSS-REFERENCE TO RELATED APPLICATIONS

This application is based upon and claims the benefit of priority from Japanese Patent Application No. 2009-289633, filed Dec. 21, 2009; the entire contents of which are incorporated herein by reference.

FIELD

Embodiments described herein relate generally to a reflective exposure mask, a method of fabricating a reflective exposure mask, a method of inspecting a reflective exposure mask, and a method of cleaning a reflective exposure mask.

BACKGROUND

In recent years, with advancement in the microfabrication of semiconductor devices, the line width of circuit patterns has been reduced more and more. To meet the demand for such reduction, the wavelength of exposure light, which is used in the exposure of a resist in the lithography process, is decreased. From the generation of a half-pitch of 22 nm of pattern width, the use of exposure light including a wavelength region centered at approximately 13.5 nm, which is called extreme ultraviolet (EUV), has been studied. It is considered that by using EUV light, a reduction in pattern width, pattern size and pattern pitch not achievable in the prior art can be realized.

However, in the exposure using EUV light, it is necessary to use a reflective exposure mask and optical system, instead of a transmissive exposure mask and optical system in the prior art. The reason for this is that in the case where the exposure mask is formed with a desired thickness, there is no mask material at present, which can pass EUV light of approximate wavelength 13.5 nm.

In the case of using a reflective mask, if radiation of EUV light to the reflective mask is continued, C-based contamination is accumulated on the reflective mask, leading to problems arising from such contamination. (See, e.g., Y. Nishiyama, et al., "Carbon contamination of EUV mask: film characterization, impact on lithographic performance, and cleaning", Proc. SPIE 6921, 692116-1 [2007]). For example, if such contamination is accumulated on the reflective mask, the reflectance of the reflective surface of the reflective mask decreases, and also the mask pattern dimensions vary. As a result, wafer transfer pattern dimensions vary, the process margin decreases and the yield decreases. In addition, owing to a difference in the state of accumulation on the reflective mask, there occurs a difference in optimal exposure at a time of wafer transfer. It is necessary, therefore, to monitor the accumulation of contamination on the reflective mask.

Methods of monitoring the contamination are generally classified into a method of directly measuring the contamination on the reflective mask and a method of monitoring the reflective mask, based on the variation of wafer transfer pattern dimensions. In the case of directly measuring the reflective mask, the reflective mask needs to be moved from an exposing device to a mask measuring device, and there arise such problems as a down-time of the exposing device due to the movement or the adhesion of particles. On the other hand, there are no such risks in the method of monitoring the reflective mask, based on the variation in wafer transfer pattern dimensions. In this case, however, not only the variation in dimensions due to the contamination accumulated on the reflective mask, but also the variation in dimensions due to contamination, etc., accumulated on, e.g., a mirror within the exposing device (optical system) is measured. As a result, the contamination accumulated on the reflective mask and the contamination accumulated on the mirror within the exposing device cannot be distinguished. Hence, there arises such a problem that the determination of the contamination accumulated on the reflective mask is very time-consuming.

BRIEF DESCRIPTION OF THE DRAWINGS

FIG. 6A is a graph showing the relationship between pattern dimension errors after transfer of a low-reflection process pattern and an absorption pattern which are perpendicular to EUV light (perpendicular pattern [0]), a perpendicular pattern (180) opposed to the perpendicular pattern (0) and a low-reflection process pattern and absorption pattern which are parallel to EUV light (parallel pattern), and the amount of accumulated contamination on the reflective exposure mask, FIG. 6B is a graph showing the relationship between the positional displacement of patterns after transfer of the perpendicular pattern (0) which is perpendicular to EUV light, the perpendicular pattern (180) which is perpendicular to EUV light and the parallel pattern which is parallel to EUV light, and the amount of accumulated contamination on the reflective exposure mask, and FIG. 6C shows the relationship between the parallel perpendicular pattern (0), perpendicular pattern (180) and parallel pattern shown in FIG. 6A or FIG. 6B and EUV light.

FIG. 7 is a cross-sectional view which schematically shows a part of a basic fabrication method of the reflective mask according to the first embodiment.

FIG. 8 is a cross-sectional view which schematically shows a part of the basic fabrication method of the reflective mask according to the first embodiment.

FIG. 9 is a cross-sectional view which schematically shows a part of the basic fabrication method of the reflective mask according to the first embodiment.

FIG. 10 is a cross-sectional view which schematically shows a part of the basic fabrication method of the reflective mask according to the first embodiment.

FIG. 11 is a cross-sectional view which schematically shows a part of the basic fabrication method of the reflective mask according to the first embodiment.

FIG. 12 is a cross-sectional view which schematically shows a part of the basic fabrication method of the reflective mask according to the first embodiment.

FIG. 13 is a cross-sectional view which schematically shows a part of the basic fabrication method of a reflective mask according to a modification of the first embodiment.

FIG. 14 is a cross-sectional view which schematically shows a part of the basic fabrication method of the reflective mask according to the modification of the first embodiment.

FIG. 15 is a cross-sectional view which schematically shows a part of the basic fabrication method of the reflective mask according to the modification of the first embodiment.

FIG. 16 is a cross-sectional view which schematically shows a part of the basic fabrication method of the reflective mask according to the modification of the first embodiment.

FIG. 17 is a cross-sectional view which schematically shows a part of the basic fabrication method of the reflective mask according to the modification of the first embodiment.

FIG. 18 is a cross-sectional view which schematically shows a part of the basic fabrication method of the reflective mask according to the modification of the first embodiment.

FIG. 19A is a top view which schematically shows a basic structure of a reflective exposure mask according to a second embodiment, and FIG. 19B is a cross-sectional view taken along line A-A in FIG. 19A.

FIG. 20A is a cross-sectional view of the reflective exposure mask according to the second embodiment, and FIG. 20B shows a transfer optical image in a case where EUV light is reflected from the reflective exposure mask shown in FIG. 20A.

FIG. 21A is a cross-sectional view of the reflective exposure mask according to the second embodiment, and FIG. 21B shows a transfer optical image in a case where EUV light is reflected from the reflective exposure mask shown in FIG. 21A.

FIG. 22A is a graph showing the relationship between pattern dimension errors after transfer of a low-reflection process pattern and an absorption pattern which are parallel to EUV light (parallel pattern) and a low-reflection process pattern and an absorption pattern which are perpendicular to EUV light (perpendicular pattern), and the amount of accumulated contamination on the reflective exposure mask, FIG. 22B is a graph showing the relationship between the positional displacement of patterns after transfer of the parallel pattern which is parallel to EUV light and the perpendicular pattern which is perpendicular to EUV light and the amount of accumulated contamination on the reflective exposure mask, and FIG. 22C shows the relationship between the parallel pattern and perpendicular pattern shown in FIG. 22A or FIG. 22B and EUV light.

FIG. 23A is a cross-sectional view of the reflective exposure mask according to the second embodiment, and FIG. 23B shows a transfer optical image in a case where EUV light is reflected from the reflective exposure mask shown in FIG. 23A.

FIG. 24A is a graph showing the relationship between pattern dimension errors after transfer of a low-reflection process pattern and an absorption pattern which are perpendicular to EUV light (perpendicular pattern [0]), a perpendicular pattern (180) opposed to the perpendicular pattern (0) and a low-reflection process pattern and absorption pattern which are parallel to EUV light (parallel pattern), and the amount of accumulated contamination on the reflective exposure mask, FIG. 24B is a graph showing the relationship between the positional displacement of patterns after transfer of the perpendicular pattern (0) which is perpendicular to EUV light, the perpendicular pattern (180) which is perpendicular to EUV light and the parallel pattern and the amount of accumulated contamination on the reflective exposure mask, and FIG. 24C shows the relationship between the perpendicular pattern (0), perpendicular pattern (180) and parallel pattern shown in FIG. 24A or FIG. 24B and EUV light.

FIG. 25 is a cross-sectional view which schematically shows a part of a basic fabrication method of the reflective mask according to the second embodiment.

FIG. 26 is a cross-sectional view which schematically shows a part of the basic fabrication method of the reflective mask according to the second embodiment.

FIG. 27 is a cross-sectional view which schematically shows a part of the basic fabrication method of the reflective mask according to the second embodiment.

DETAILED DESCRIPTION

In general, according to one embodiment, a reflective exposure mask comprises a first layer formed on a substrate and including a first light absorbing part which absorbs exposure light and a light reflecting part which reflects the exposure light; and a second layer formed on the light reflecting part and including a second light absorbing part which absorbs the exposure light.

The details of embodiments will now be described with reference to the accompanying drawings.

(First Embodiment)

Figures 1A, 1B:
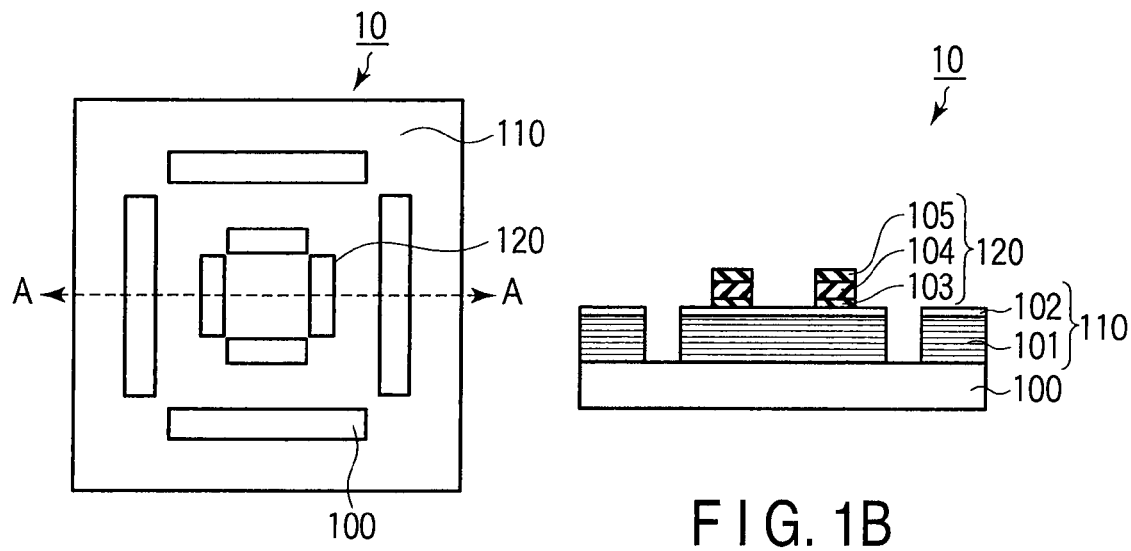
FIG. 1A is a top view which schematically shows a basic structure of a reflective exposure mask according to a first embodiment.
FIG. 1B is a cross-sectional view taken along line A-A in FIG. 1A.

Referring to FIG. 1A and FIG. 1B, a description is given of the basic structure of a reflective exposure mask according to a first embodiment. FIG. 1A is a top view which schematically shows the basic structure of the reflective exposure mask according to the first embodiment, and FIG. 1B is a cross-sectional view taken along line A-A in FIG. 1A.

As shown in FIGS. 1A and 1B, a reflective mask (reflective exposure mask) 10 has a structure in which a support substrate 100, a reflective layer 110 provided on the support substrate 100, and an absorption layer 120 provided on the reflective layer 110 are stacked.

The support substrate 100 is, for example, a synthetic quartz substrate. In the case where the support substrate 100 is used for EUV exposure light (EUV lithography), it is preferable to use an extremely-low expansion glass substrate containing e.g., titanium, from the standpoint of exposure precision, etc.

The reflective layer 110 includes a reflective multilayer film 101 in which, for example, about 40 pairs of layers of molybdenum and silicon are alternately stacked in order to substantially reflect EUV light (exposure light), and a protective layer (capping layer) 102 which is formed of silicon on the reflective multilayer film 101.

The absorption layer 120 includes a buffer layer 103 formed of CrN which substantially absorbs EUV (soft X-ray or extreme ultraviolet) light, an absorber 104 which is formed of TaBN on the buffer layer 103, and a low-reflection (LR) layer 105 for a mask defect inspection, which is formed of, e.g., TaO or TaBO on the absorber 104.

A projection pattern (absorption pattern) is formed on the absorption layer 120. In addition, a recess pattern which is subjected to a low-reflection process ("low-reflection process pattern") is formed near the absorption pattern in the reflective layer 110, and a part of the support substrate 100 is exposed. The low-reflection process pattern and the absorption pattern are, for example, a bar-in-bar pattern, and the low-reflection process pattern is an outer pattern and the absorption pattern is an inner pattern. The combination of the low-reflection process pattern and the absorption pattern is configured, for example, as a contamination inspection pattern.

The contamination inspection pattern is formed, for example, on the outside of a region (device formation region) where a device is formed, and is formed with, for example, a misalignment mark. It is desirable that a plurality of such contamination inspection patterns be provided.

The reflective multilayer film 101 and low-reflection process pattern constitute a first layer, and the absorption layer 120 constitutes a second layer. The reflective multilayer film 101 corresponds to a light reflecting part, the low-reflection process pattern corresponds to a first light absorbing part, and the absorption layer 120 corresponds to a second light absorbing part.

Next, referring to FIGS. 2A, 2B, 3A, 3B, 4A, 4B, 4C, 5A, 5B, 6A, 6B and 6C, a description is given of the outline of an inspection method using the reflective exposure mask according to the first embodiment.

Figure 2A:
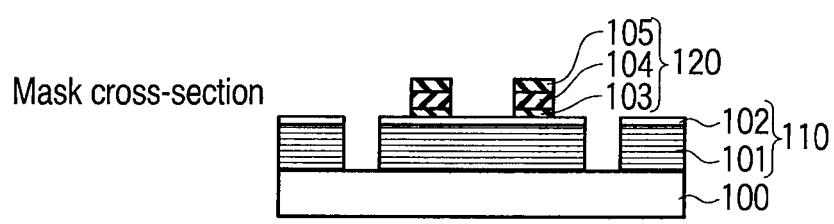
FIG. 2A is a cross-sectional view of the reflective exposure mask according to the first embodiment.
Figure 2B:
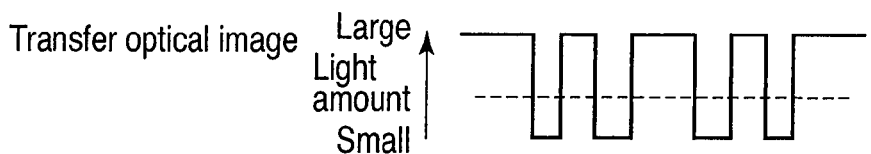
FIG. 2B shows a transfer optical image in a case where EUV light is reflected from the reflective exposure mask shown in FIG. 2A.
Figure 3A:
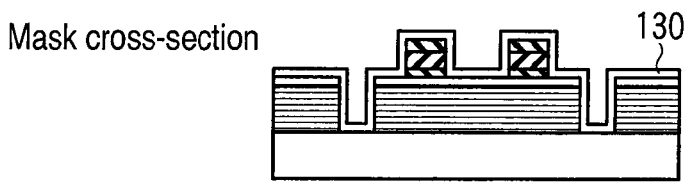
FIG. 3A is a cross-sectional view of the reflective exposure mask according to the first embodiment.
Figure 3B:
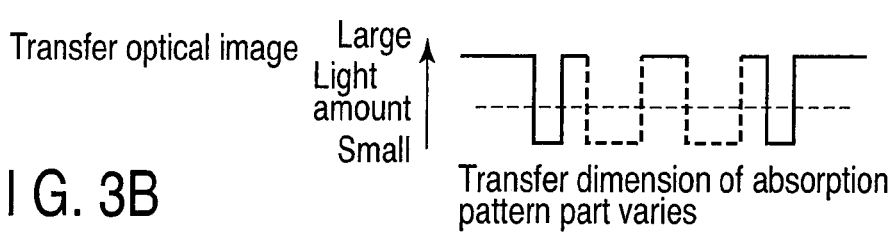
FIG. 3B shows a transfer optical image in a case where EUV light is reflected from the reflective exposure mask shown in FIG. 3A.
Figure 5A:
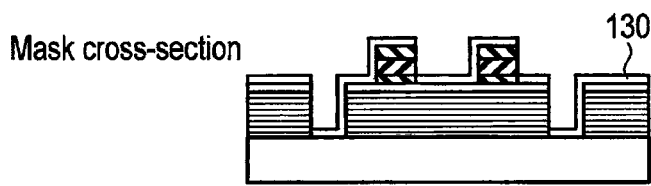
FIG. 5A is a cross-sectional view of the reflective exposure mask according to the first embodiment.
Figure 5B:
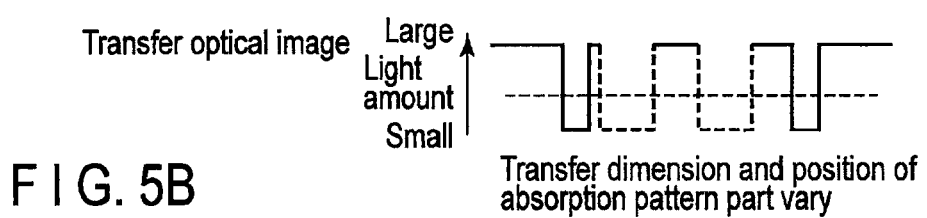
FIG. 5B shows a transfer optical image in a case where EUV light is reflected from the reflective exposure mask shown in FIG. 5A.

FIG. 2A, FIG. 3A and FIG. 5A are cross-sectional views of the reflective exposure mask according to the first embodiment, and FIG. 2B, FIG. 3B and FIG. 5B show transfer optical images in cases where EUV light is reflected from the reflective exposure masks shown in FIG. 2A, FIG. 3A and FIG. 5A. In each of FIG. 2B, FIG. 3B and FIG. 5B, a central broken line indicates a threshold amount of light.

An inspection using the reflective mask 10 according to the first embodiment is performed by radiating EUV light on the reflective mask 10, and monitoring a variation of dimensions of a wafer transfer pattern which is formed by EUV light reflected on a wafer (not shown).

If EUV light is radiated on the reflective mask shown in FIG. 2A, the EUV light is reflected as shown in FIG. 2B.

As shown in FIG. 3A, when contamination 130 is uniformly accumulated on the reflective mask 10, the amount of light at the low-reflection process pattern is unchanged as shown in FIG. 3B, but the dimensions of the absorption pattern increase and the amount of light reflected from the reflective layer between the low-reflection process pattern and the absorption pattern decreases. In other words, the width of reflected light decreases.

Figure 4A:
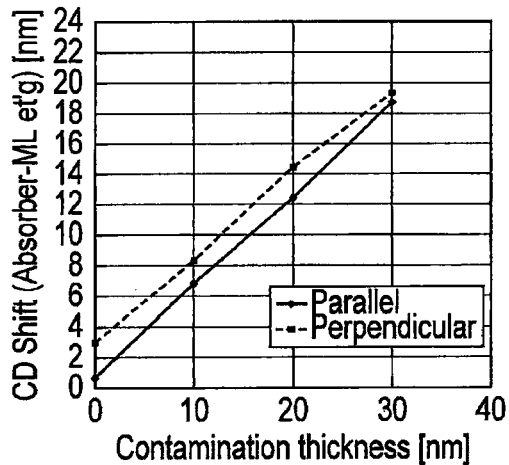
FIG. 4A is a graph showing the relationship between pattern dimension errors after transfer of a low-reflection process pattern and an absorption pattern which are parallel to EUV light (parallel pattern) and a low-reflection process pattern and an absorption pattern which are perpendicular to EUV light (perpendicular pattern), and the amount of accumulated contamination on the reflective exposure mask.
Figure 4B:
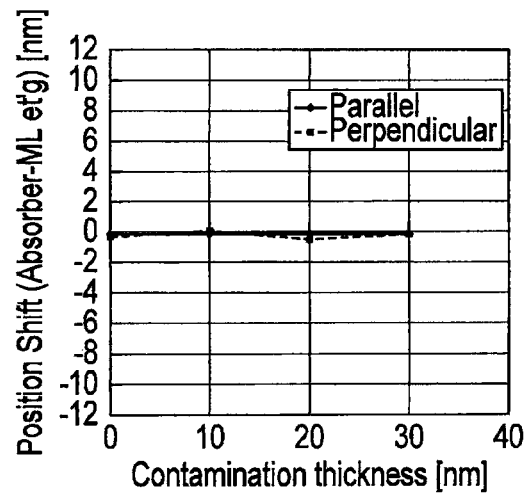
FIG. 4B is a graph showing the relationship between the positional displacement of patterns after transfer of the parallel pattern which is parallel to EUV light and the perpendicular pattern which is perpendicular to EUV light and the amount of accumulated contamination on the reflective exposure mask.
Figure 4C:
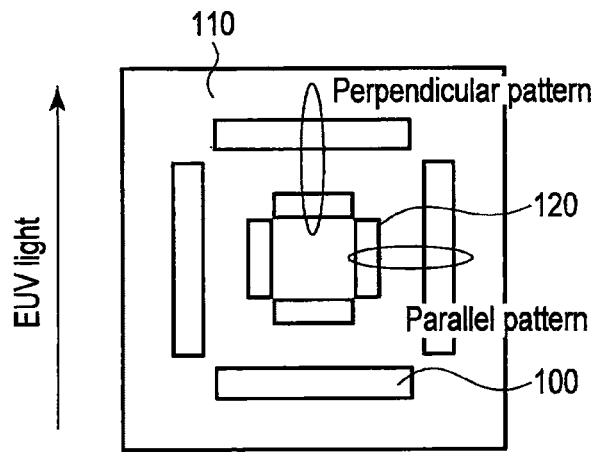
FIG. 4C shows the relationship between the parallel pattern and perpendicular pattern shown in FIG. 4A or FIG. 4B and EUV light.

FIG. 4A shows the relationship between pattern dimension errors after transfer of the low-reflection process pattern and absorption pattern which are parallel to the direction of radiation (incidence) of EUV light (parallel pattern) and the low-reflection process pattern and absorption pattern which are perpendicular to the direction of radiation (incidence) of EUV light (perpendicular pattern), and the amount of accumulated contamination on the reflective exposure mask. Specifically, FIG. 4A shows the relationship between the value, which is obtained by subtracting the transfer dimension of the low-reflection process pattern from the transfer dimension of the absorption pattern formed of the absorber, and the thickness of the contamination accumulated on the reflective mask 10. FIG. 4B shows the relationship between the positional displacement of patterns after transfer of the parallel pattern which is parallel to EUV light and the perpendicular pattern which is perpendicular to EUV light and the amount of accumulated contamination on the reflective exposure mask. For example, by measuring the difference between the centers of the transfer optical images of the low-reflection process pattern and the absorption pattern, the variation of the center can be measured. Thereby, the positional displacement of the patterns after transfer can be determined. FIG. 4C shows the relationship between the parallel pattern and perpendicular pattern shown in FIG. 4A or FIG. 4B and EUV light.

When lithography is performed by using the reflective mask, light (EUV light) reflected by the reflective layer has to be made incident on a projection optical system without interference between the reflected light and incident light (EUV light). Thus, the incident light, which is made incident on the reflective mask, is obliquely made incident (offset incidence) at a predetermined angle (offset angle) to the normal to the reflective mask surface. The parallel pattern is a pattern which is parallel to a plane including the normal to the reflective mask surface and the direction of incident light, and is perpendicular to the normal. As regards the perpendicular pattern, the direction perpendicular to the plane including the normal to the reflective mask surface and the direction of incident light is referred to as a perpendicular direction which is perpendicular to the EUV light.

As shown in FIG. 4B, it is understood that when contamination is uniformly accumulated on the reflective mask 10, no positional displacement occurs in the pattern parallel to the EUV light and the pattern perpendicular to the EUV light.

As shown in FIG. 5A, when contamination 130 is anisotropically accumulated on the reflective mask 10, the amount of light at the low-reflection process pattern is unchanged as shown in FIG. 5B, but the dimension of the absorption pattern increases in the direction of accumulation of the contamination, and the amount of light reflected from the reflective layer between the low-reflection process pattern and the absorption pattern on the side on which the contamination is accumulated decreases.

FIG. 6A shows the relationship between pattern dimension errors after transfer of a low-reflection process pattern and an absorption pattern which are perpendicular to EUV light (perpendicular pattern [0]), a perpendicular pattern (180) opposed to the perpendicular pattern (0) and a low-reflection process pattern and absorption pattern which are parallel to EUV light (parallel pattern), and the amount of accumulated contamination on the reflective exposure mask. Specifically, FIG. 6A shows the relationship between the value, which is obtained by subtracting the transfer dimension of the low-reflection process pattern from the transfer dimension of the absorption pattern formed of the absorber, and the thickness of the contamination accumulated on the reflective mask 10. FIG. 6B shows the relationship between the positional displacement of patterns after transfer of the perpendicular pattern (0) which is perpendicular to EUV light, the perpendicular pattern (180) which is perpendicular to EUV light and the parallel pattern which is parallel to EUV light, and the amount of accumulated contamination on the reflective exposure mask. For example, by measuring the difference between the centers of the transfer optical images of the low-reflection process pattern and the absorption pattern, the variation of the center can be measured. Thereby, the positional displacement of the patterns after transfer can be determined. FIG. 6C shows the relationship between the perpendicular pattern (0), perpendicular pattern (180) and parallel pattern shown in FIG. 6A or FIG. 6B and EUV light.

As shown in FIG. 6B, it is understood that when contamination is anisotropically accumulated on the reflective mask 10, positional displacement occurs in the pattern perpendicular to the direction of accumulation of contamination.

According to the above-described embodiment, the reflective exposure mask of the first embodiment is inspected by using the reflective mask in which the recess-type low-reflection process pattern and the projection-type absorption pattern are adjacently provided. Even if contamination is accumulated on the inside of the recess-type low-reflection process pattern, the dimensions of the transfer pattern do not vary. However, since the absorption pattern is of the projection type, if contamination is accumulated on the side wall of the absorption pattern, the dimensions of the transfer pattern vary. By measuring the difference in dimension between the recess-type low-reflection process pattern and the projection-type absorption pattern, the variation of the dimensions of the transfer pattern and the displacement of the transfer position can be determined. Thus, based on the variation of the dimensions of the transfer pattern and the displacement of the transfer position, it is possible to discriminate the variation in dimension and the variation in transfer position, which are caused by the contamination accumulated on the reflective mask and the variation in dimension and the variation in transfer position, which are caused by the contamination accumulated on the mirror within the exposure device.

As a result, it is possible to discriminate the contamination accumulated on the reflective mask and the contamination accumulated on the part other than the reflective mask (e.g., the contamination accumulated on the mirror within the exposure device). Thereby, the contamination accumulated on the reflective mask can easily be determined.

According to the above-described embodiment, if it is determined that the variation in dimension and the variation in transfer position, which are caused by the contamination accumulated on the reflective mask, are predetermined values or more, the contamination is removed. For example, the contamination is removed by cleaning the reflective mask.

In addition, the variations of the transfer pattern dimensions and the transfer position may be recorded, and thereby it is possible to determine, based on the record, a proper timing of cleaning the reflective mask (within a predetermined range of a tolerable amount of accumulated contamination).

As regards the low-reflection process pattern and absorption pattern (contamination inspection patterns), for example, a plurality of such low-reflection process patterns and absorption patterns are formed on the outside of a device pattern which is formed on the reflective mask. An inspection of contamination can be conducted at the same time as the formation of the device. It is thus possible to automatically inspect the contamination inspection patterns in the process of fabricating the device. Thereby, the reflective mask can properly be cleaned at a proper timing before the variation in dimension and the variation in transfer position, which are caused by the contamination, exceed predetermined values.

Next, referring to FIGS. 7, 8, 9, 10, 11 and 12, the outline of a basic fabrication method of the reflective mask 10 according to the first embodiment is described. FIGS. 7, 8, 9, 10, 11 and 12 are cross-sectional views which schematically illustrate the basic fabrication method of the reflective mask 10 according to the first embodiment.

As shown in FIG. 7, a synthetic quartz substrate (a substrate with a low coefficient of thermal expansion) having each side of 6 inches is prepared as a support substrate 100. Using an Mo material and an Si material as targets, about 40 pairs of layers of molybdenum and silicon are alternately stacked by an ion beam sputtering device. Thereby, a reflective multilayer film (Mo/Si multilayer film) 101 is formed. Silicon (Si) which becomes a protective layer (capping layer) 102 is formed on the reflective multilayer film 101. CrN, which becomes a buffer layer 103 that absorbs EUV light, is formed on the protective layer 102. TaBN, which becomes an absorber 104 that absorbs EUV light, is formed on the buffer layer 103. Subsequently, TaO, which becomes a low-reflection layer 105 for a mask defect inspection, is formed on the absorber 104. Thereby, a reflective mask blank 11 is formed.

Next, as shown in FIG. 8, a positive-type resist for EB drawing is coated on the reflective mask blank 11, thus forming a resist layer 106. By EB drawing, a desired pattern is drawn on the resist layer 106. This pattern is a pattern which later becomes an absorption pattern (inner pattern). Then, the resist layer 106 is patterned by development, and the low-reflection layer 105 and absorber 104 are processed by reactive ion etching (RIE). Thus, a pattern is formed.

As shown in FIG. 9, the patterned resist layer 106 is peeled and cleaning is performed.

As shown in FIG. 10, a resist layer 107 is formed on the buffer layer 103 and low-reflection layer 105. By EB drawing, a desired pattern is drawn on the resist layer 107. This pattern is a pattern which later becomes a low-reflection process pattern (outer pattern). Then, the resist layer 107 is patterned by development, and the low-reflection layer 105, absorber 104, buffer layer 103, protective layer 102 and reflective multilayer film 101 are removed by RIE.

Subsequently, as shown in FIG. 11, the patterned resist layer 107 is peeled and cleaning is performed. If an inspection of the reflective mask, which is in the process of formation, is conducted and there is a defect or the like, such a defect is eliminated. If an inspection of the reflective mask, which is in the process of formation, is conducted and there is no defect or the like, this reflective mask, which is in the process of formation, is cleaned.

Thereafter, as shown in FIG. 12, the buffer layer 103 is removed and cleaning is performed once again. A final inspection step is performed, and the reflective mask 10 is completely fabricated.

(Modification)

Next, referring to FIGS. 13, 14, 15, 16, 17 and 18, the outline of a basic fabrication method of a reflective mask 10 according to a modification of the first embodiment is described. FIGS. 13, 14, 15, 16, 17 and 18 are cross-sectional views which schematically illustrate the basic fabrication method of the reflective mask 10 according to the modification of the first embodiment. The basic structure and basic fabrication method of this modification are the same as in the above-described embodiment. Thus, a description is omitted of matters which have been described in connection with the above-described embodiment, and matters which can easily be guessed from the above-described embodiment.

As shown in FIG. 13, a synthetic quartz substrate (a substrate with a low coefficient of thermal expansion) having each side of 6 inches is prepared as a support substrate 100.

Using an Mo material and an Si material as targets, about 40 pairs of layers of molybdenum and silicon are alternately stacked by an ion beam sputtering device. Thereby, a reflective multilayer film (Mo/Si multilayer film) 101 is formed. Silicon (Si) which becomes a protective layer (capping layer) 102 is formed on the reflective multilayer film 101. CrN, which becomes a buffer layer 103 that absorbs EUV light, is formed on the protective layer 102. TaBN, which becomes an absorber 104 that absorbs EUV light, is formed on the buffer layer 103. Subsequently, TaO, which becomes low-reflection layer 105 for a mask defect inspection, is formed on the absorber 104. Thereby, a reflective mask blank 11 is formed.

Next, as shown in FIG. 14, a positive-type resist for EB drawing is coated on the reflective mask blank 11, thus forming a resist layer 106. By EB drawing, a desired pattern is drawn on the resist layer 106. This pattern is a pattern which later becomes an absorption pattern (inner pattern) and a low-reflectance process pattern (outer pattern). Then, the resist layer 106 is patterned by development, and the low-reflection layer 105 and absorber 104 are processed by RIE. Thus, a pattern is formed.

As shown in FIG. 15, the patterned resist layer 106 is peeled and cleaning is performed.

As shown in FIG. 16, a resist layer 107 is formed on the buffer layer 103 and low-reflection layer 105. By EB drawing, a desired pattern is drawn on the resist layer 107. This pattern is a pattern which later becomes a low-reflection process pattern (outer pattern). Then, the resist layer 107 is patterned by development, and the buffer layer 103, protective layer 102 and reflective multilayer film 101 are removed by RIE.

Subsequently, as shown in FIG. 17, the patterned resist layer 107 is peeled and cleaning is performed. If an inspection of the reflective mask, which is in the process of formation, is conducted and there is a defect or the like, such a defect is eliminated. If an inspection of the reflective mask, which is in the process of formation, is conducted and there is no defect or the like, this reflective mask, which is in the process of formation, is cleaned.

Thereafter, as shown in FIG. 18, the exposed buffer layer 103 is removed and cleaning is performed once again. A final inspection step is performed, and the reflective mask 10 is completely fabricated.

(Second Embodiment)

Referring to FIG. 19A and FIG. 19B, a description is given of the basic structure of a reflective exposure mask according to a second embodiment. FIG. 19A is a top view which schematically shows the basic structure of the reflective exposure mask according to the second embodiment, and FIG. 19B is a cross-sectional view taken along line A-A in FIG. 19A.

As shown in FIGS. 19A and 19B, a reflective mask (reflective-projection exposure mask) 20 has a structure in which a support substrate 100, a reflective layer 110 provided on the support substrate 100, and an absorption layer 120 provided on the reflective layer 110 are stacked.

The support substrate 100 is, for example, a synthetic quartz substrate. In the case where the support substrate 100 is used for EUV exposure light (EUV lithography), it is preferable to use an extremely-low expansion glass substrate containing e.g., titanium, from the standpoint of exposure precision, etc.

The reflective layer 110 includes a reflective multilayer film 101 in which, for example, about 40 pairs of layers of molybdenum and silicon are alternately stacked in order to substantially reflect EUV light, a protective layer (capping layer) 102 which is formed of silicon on the reflective multilayer film 101, and a low-reflection process region 140.

The low-reflection process region 140 is, for example, molybdenum silicide which substantially absorbs EUV light. In addition, the low-reflection process region 140 is a low-reflection process pattern. The surface of the low-reflection process region 140 is substantially on a level with the surface of the reflective surface 110. Besides, the low-reflection process region 140 is formed by subjecting the reflective layer 110 to an energy beam irradiation process.

The absorption layer 120 includes a buffer layer 103 formed of CrN which substantially absorbs EUV (soft X-ray or extreme ultraviolet) light, an absorber 104 which is formed of TaBN on the buffer layer 103, and a low-reflection (LR) layer 105 for a mask defect inspection, which is formed of, e.g., TaO or TaBO on the absorber 104.

A projection pattern (absorption pattern) is formed on the absorption layer 120. The absorption pattern is formed near the low-reflection process pattern. The low-reflection process pattern and the absorption pattern are, for example, a bar-in-bar pattern, and the low-reflection process pattern is an outer pattern and the absorption pattern is an inner pattern.

The low-reflection process pattern and absorption pattern are formed, for example, on the outside of a region where a device is formed, and is formed with, for example, a misalignment mark.

The reflective multilayer film 101 and low-reflection process region 140 constitute a first layer, and the absorption layer 120 constitutes a second layer. The reflective multilayer film 101 corresponds to a light reflecting part, the low-reflection process region 140 corresponds to a first light absorbing part, and the absorption layer 120 corresponds to a second light absorbing part.

Next, referring to FIGS. 20A, 20B, 21A, 21B, 22A, 22B, 22C, 23A, 23B, 24A, 24B and 24C, a description is given of the outline of an inspection method of the reflective mask according to the second embodiment. The basic structure and basic fabrication method of the second embodiment are the same as in the above-described first embodiment. Thus, a description is omitted of matters which have been described in connection with the above-described first embodiment, and matters which can easily guessed from the above-described first embodiment.

FIG. 20A, FIG. 21A and FIG. 23A are cross-sectional views of the reflective exposure mask according to the second embodiment, and FIG. 20B, FIG. 21B and FIG. 23B show transfer optical images in cases where EUV light is reflected from the reflective exposure masks shown in FIG. 20A, FIG. 21A and FIG. 23A. In each of FIG. 20B, FIG. 21B and FIG. 23B, a central broken line indicates a threshold amount of light.

An inspection using the reflective mask 20 according to the second embodiment is performed by radiating EUV light on the reflective mask 20, and monitoring a variation of dimensions of a wafer transfer pattern which is formed by EUV light reflected on a wafer (not shown).

If EUV light is radiated on the reflective mask shown in FIG. 20A, the EUV light is reflected as shown in FIG. 20B.

As shown in FIG. 21A, when contamination 150 is uniformly accumulated on the reflective mask 10, the amount of light at the low-reflection process pattern is unchanged as shown in FIG. 21B, but the dimensions of the absorption pattern increase and the amount of light reflected from the reflective layer between the low-reflection process pattern and the absorption pattern decreases.

FIG. 22A shows the relationship between pattern dimension errors after transfer of the low-reflection process pattern and absorption pattern which are parallel to EUV light (parallel pattern) and the low-reflection process pattern and absorption pattern which are perpendicular to EUV light (perpendicular pattern), and the amount of accumulated contamination on the reflective exposure mask. FIG. 22B shows the relationship between the positional displacement of patterns after transfer of the parallel pattern which is parallel to EUV light and the perpendicular pattern which is perpendicular to EUV light and the amount of accumulated contamination on the reflective exposure mask. FIG. 22C shows the relationship between the parallel pattern and perpendicular pattern shown in FIG. 22A or FIG. 22B and EUV light.

As shown in FIG. 22B, it is understood that when contamination is uniformly accumulated on the reflective mask 20, no positional displacement occurs in the pattern parallel to the EUV light and the pattern perpendicular to the EUV light.

As shown in FIG. 23A, when contamination 150 is anisotropically accumulated on the reflective mask 20, the amount of light at the low-reflection process pattern is unchanged as shown in FIG. 23B, but the dimension of the absorption pattern increases in the direction of accumulation of the contamination, and the amount of light reflected from the reflective layer between the low-reflection process pattern and the absorption pattern on the side on which the contamination is accumulated decreases.

FIG. 24A shows the relationship between pattern dimension errors after transfer of a low-reflection process pattern and an absorption pattern which are perpendicular to EUV light (perpendicular pattern [0]), a perpendicular pattern (180) opposed to the perpendicular pattern (0) and a low-reflection process pattern and absorption pattern which are parallel to EUV light (parallel pattern), and the amount of accumulated contamination on the reflective exposure mask. FIG. 24B shows the relationship between the positional displacement of patterns after transfer of the perpendicular pattern (0) which is perpendicular to EUV light, the perpendicular pattern (180) which is perpendicular to EUV light and the parallel pattern which is parallel to EUV light, and the amount of accumulated contamination on the reflective exposure mask. FIG. 24C shows the relationship between the perpendicular pattern (0), perpendicular pattern (180) and parallel pattern shown in FIG. 24A or FIG. 24B and EUV light.

As shown in FIG. 24B, it is understood that when contamination is anisotropically accumulated on the reflective mask 20, positional displacement occurs in the pattern perpendicular to the direction of accumulation of contamination.

According to the above-described embodiment, the reflective exposure mask of the second embodiment is inspected by using the reflective mask in which the low-reflection process pattern, which is substantially flat relative to the reflective layer 110, and the projection-type absorption pattern are adjacently provided. Even if contamination is accumulated on the substantially flat low-reflection process pattern, the transfer optical image is not so greatly affected as in the case where contamination is accumulated on the absorption pattern, and the dimensions of the transfer pattern do not vary. However, since the absorption pattern is of the projection type, if contamination is accumulated on the side wall of the absorption pattern, the dimensions of the transfer pattern vary. By measuring the difference in dimension between the substantially flat low-reflection process pattern and the projection-type absorption pattern, the variation of the dimensions of the transfer pattern and the displacement of the transfer position can be determined. Thus, based on the variation of the dimensions of the transfer pattern and the displacement of the transfer position, it is possible to discriminate the variation in dimension and the variation in transfer position, which are caused by the contamination accumulated on the reflective mask and the variation in dimension and the variation in transfer position, which are caused by the contamination accumulated on the mirror within the exposure device.

As a result, like the first embodiment, it is possible to discriminate the contamination accumulated on the reflective mask and the contamination other than the contamination accumulated on the reflective mask. Thereby, the contamination accumulated on the reflective mask can easily be determined.

Next, referring to FIGS. 25, 26, 27, 28, 29 and 30, the outline of a basic fabrication method of the reflective mask 20 according to the second embodiment is described. FIGS. 25, 26, 27, 28, 29 and 30 are cross-sectional views which schematically illustrate the basic fabrication method of the reflective mask according to the second embodiment.

As shown in FIG. 25, a synthetic quartz substrate having each side of 6 inches is prepared as a support substrate 100. Using an Mo material and an Si material as targets, about 40 pairs of layers of Mo and Si are alternately stacked by an ion beam sputtering device. Thereby, a reflective multilayer film 101 is formed. Silicon (Si) which becomes a protective layer 102 is formed on the reflective multilayer film 101. CrN, which becomes a buffer layer 103 that absorbs EUV light, is formed on the protective layer 102. TaBN, which becomes an absorber 104 that absorbs EUV light, is formed on the buffer layer 103. Subsequently, TaO, which becomes a low-reflection layer 105 for a mask defect inspection, is formed on the absorber 104. Thereby, a reflective mask blank 11 is formed.

Next, as shown in FIG. 26, a positive-type resist for EB drawing is coated on the reflective mask blank 11, thus forming a resist layer 106. By EB drawing, a desired pattern is drawn on the resist layer 106. This pattern is a pattern which later becomes an absorption pattern (inner pattern) and a low-reflection process pattern (outer pattern). Then, the resist layer 106 is patterned by development, and the low-reflection layer 105 and absorber 104 are processed by RIE. Thus, a pattern is formed.

As shown in FIG. 27, the patterned resist layer 106 is peeled and cleaning is performed.

Figure 28:
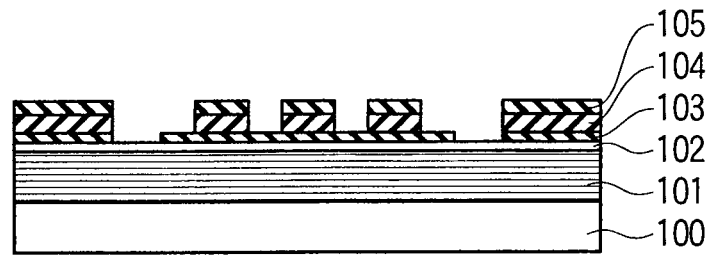
FIG. 28 is a cross-sectional view which schematically shows a part of the basic fabrication method of the reflective mask according to the second embodiment.

As shown in FIG. 28, a resist layer (not shown) is formed on the buffer layer 103 and low-reflection layer 105. By EB drawing, a desired pattern is drawn on the resist layer. This pattern is a pattern which later becomes a low-reflection process pattern (outer pattern). Then, the resist layer is patterned by development, and the buffer layer 103 is removed by RIE. The patterned resist layer is peeled and cleaning is performed.

Figure 29:
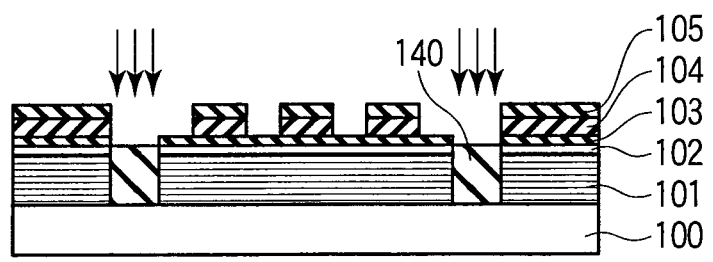
FIG. 29 is a cross-sectional view which schematically shows a part of the basic fabrication method of the reflective mask according to the second embodiment.

Subsequently, as shown in FIG. 29, an energy beam irradiation process (laser annealing) is performed on the exposed reflective multilayer film 101, and molybdenum silicide is formed. This molybdenum silicide becomes a low-reflection process region 140 which substantially absorbs EUV light. The surface of the low-reflection process region 140 is substantially on a level with the surface of the reflective layer 110. The energy beam is a laser beam or an ion beam. Following the energy beam irradiation process, the reflective mask which is in the process of formation is cleaned. If an inspection of the reflective mask, which is in the process of formation, is conducted and there is a defect or the like, such a defect is eliminated. If an inspection of the reflective mask, which is in the process of formation, is conducted and there is no defect or the like, this reflective mask, which is in the process of formation, is cleaned.

Figure 30:
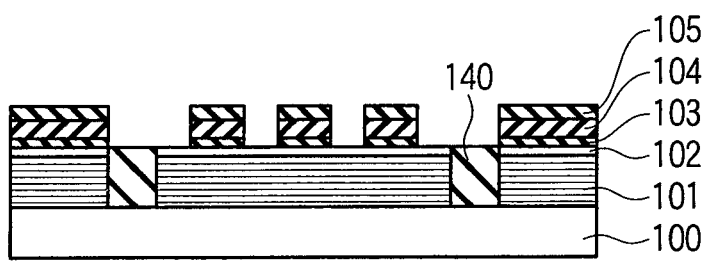
FIG. 30 is a cross-sectional view which schematically shows a part of the basic fabrication method of the reflective mask according to the second embodiment.

Thereafter, as shown in FIG. 30, the exposed buffer layer 103 is removed and cleaning is performed once again. A final inspection step is performed, and the reflective mask 20 is completely fabricated.

In each of the above-described embodiments, as regards the low-reflection process pattern and absorption pattern (contamination inspection patterns) which are monitor patterns, patterns called "bar-in-bar patterns" are used by way of example. However, the low-reflection process pattern and absorption pattern are not limited to this example, if the low-reflection process pattern and absorption pattern are patterns for measuring dimensions and positional displacements. For instance, box-in-box patterns may be used. Besides, in each of the above-described embodiments, the low-reflection process pattern is used as an outer pattern and the absorption pattern is used as an inner pattern. Alternatively, the low-reflection process pattern may be used as an inner pattern and the absorption pattern may be used as an outer pattern.

In each of the embodiments, the dimensions and positional displacement are measured by performing wafer transfer. Alternatively, without performing wafer transfer, the dimensions and positional displacement may be measured by acquiring a transfer optical image in association with the monitor patterns on the mask.

In each of the embodiments, Si is used as the protective layer 102, and CrN is used as the buffer layer 103. Alternatively, use may be made of a material mainly comprising Ru, which serves as both the protective layer 102 and buffer layer 103. In addition, the low-reflection layer 105 for a reflective mask defect inspection is used on the absorber 104. However, when the EB device is used as the mask defect inspection device, the low-reflection layer 105 is not always necessary. Although the reflective multilayer film 101 is directly formed on the support substrate (substrate with a low coefficient of thermal expansion) 100, an electrically conductive film may be provided between the support substrate 100 and reflective multilayer film 101, thereby to secure the electrical conductivity of the reflective mask.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A reflective exposure mask comprising:
   a first layer formed on a substrate and including:
      a first light absorbing part which absorbs exposure light; and
      a light reflecting part which reflects the exposure light; and
   a second layer formed on the light reflecting part and including a second light absorbing part which absorbs the exposure light,
   wherein the light reflecting part includes:
      a covered portion covered by the second light absorbing part, and
      an uncovered portion not covered by the second light absorbing part, and
   wherein the first light absorbing part is surrounded by only the uncovered portion.

2. The reflective exposure mask of claim 1, wherein the first light absorbing part is a recess pattern.

3. The reflective exposure mask of claim 1, wherein a height of a surface of the first light absorbing part is substantially equal to a height of a surface of the light reflecting part.

4. The reflective exposure mask of claim 1, wherein the first light absorbing part and the second light absorbing part are formed outside a device formation region.

5. The reflective exposure mask of claim 1, wherein the first light absorbing part and the second light absorbing part form a bar-in-bar pattern or a box-in-box pattern.

6. The reflective exposure mask of claim 1, wherein:
   the first light absorbing part and the second light absorbing part are positioned so that the first light absorbing part and the second light absorbing part are perpendicular to the exposure light, are separate from each other, and are adjacent to each other,
   the first layer further comprises a third light absorbing part which absorbs exposure light,
   the second layer further comprises a fourth light absorbing part which absorbs exposure light, and
   the third light absorbing part and the fourth light absorbing part are positioned so that the third light absorbing part and the fourth light absorbing part are parallel to the exposure light, are separate from each other, and are adjacent to each other.

* * * * *